US008183195B2

(12) United States Patent
Westwood

(10) Patent No.: US 8,183,195 B2
(45) Date of Patent: May 22, 2012

(54) PEROXIDE ACTIVATED OXOMETALATE BASED FORMULATIONS FOR REMOVAL OF ETCH RESIDUE

(75) Inventor: Glenn L. Westwood, Bethlehem, PA (US)

(73) Assignee: Avantor Performance Materials, Inc., Phillipsburg, NJ (US)

( * ) Notice: Subject to any disclaimer, the term of this patent is extended or adjusted under 35 U.S.C. 154(b) by 504 days.

(21) Appl. No.: 12/522,716

(22) PCT Filed: Jan. 28, 2008

(86) PCT No.: PCT/US2008/001103

§ 371 (c)(1),
(2), (4) Date: Jul. 10, 2009

(87) PCT Pub. No.: WO2008/100377

PCT Pub. Date: Aug. 21, 2008

(65) Prior Publication Data

US 2010/0035786 A1 Feb. 11, 2010

Related U.S. Application Data

(60) Provisional application No. 60/889,762, filed on Feb. 14, 2007.

(51) Int. Cl.
*G03F 7/42* (2006.01)

(52) U.S. Cl. ........................ 510/176; 510/175; 252/79.1

(58) Field of Classification Search .................. 510/175, 510/176; 252/79.1
See application file for complete search history.

(56) References Cited

U.S. PATENT DOCUMENTS 4,130,454 A 12/1978 Dutkewych et al.
4,144,119 A 3/1979 Dutkewych et al.
4,247,490 A 1/1981 Eckert
4,419,183 A 12/1983 Gulla et al.
4,465,403 A 8/1984 Skee
4,857,225 A 8/1989 Terada et al.
5,041,142 A 8/1991 Ellis
5,904,734 A 5/1999 Friberg et al.
6,022,837 A 2/2000 Oowaki
6,454,819 B1 * 9/2002 Yano et al. .................... 51/298
6,465,403 B1 * 10/2002 Skee .................... 510/175
6,585,825 B1 * 7/2003 Skee .................... 134/3
6,599,370 B2 * 7/2003 Skee .................... 134/3
6,803,353 B2 * 10/2004 Martyak et al. .................... 510/175
6,918,820 B2 * 7/2005 Smith et al. .................... 451/41
7,297,669 B2 * 11/2007 Martyak et al. .................... 510/175
7,358,218 B2 * 4/2008 Muradov .................... 510/240
7,375,069 B2 * 5/2008 Muradov .................... 510/240
7,671,001 B2 * 3/2010 Skee .................... 510/175
7,678,605 B2 * 3/2010 Schlueter et al. .................... 438/95
7,767,636 B2 * 8/2010 Hsu .................... 510/175
2002/0077259 A1 * 6/2002 Skee .................... 510/175
2003/0231979 A1 12/2003 Silveri
2004/0092106 A1 * 5/2004 Martyak et al. .................... 438/689
2004/0180802 A1 9/2004 Hubig et al.
2004/0203324 A1 * 10/2004 Smith et al. .................... 451/41
2004/0220065 A1 11/2004 Hsu
2005/0176250 A1 * 8/2005 Takahashi et al. .................... 438/691
2006/0116281 A1 6/2006 Busch et al.
2006/0254504 A1 11/2006 Dai et al.
2007/0060490 A1 * 3/2007 Skee .................... 510/175
2009/0057834 A1 * 3/2009 Schlueter et al. .................... 257/613
2009/0163396 A1 * 6/2009 Hsu .................... 510/176
2010/0035786 A1 * 2/2010 Westwood .................... 510/176
2011/0130077 A1 * 6/2011 Litke et al. .................... 451/41

FOREIGN PATENT DOCUMENTS

WO WO 03/006597 1/2003

OTHER PUBLICATIONS

Aubry et al., "Preparative Oxidation of Organic Compounds in Microemulsions with Singlet Oxygen Generated chemically by the Sodium Molybdate/Hydrogen Peroxide System", JACS, 1997, 119, pp. 5286-5294.
Niu et al., "Singlet Molecular Oxygen generation from the Decomposition of Sodium Peroxotungstate and Sodium Peroxomolybdate", Inorganic Chemistry, 1992, 31, pp. 3472-3476.
Dejule (Associate Editor); "Managing Etch and Implant Residue", Semiconductor International, Aug. 1997, pp. 56-63.
Boumerzoug et al., "Removal of Titanium Oxide Grow on Titanium Nitride and Reduction of Via Contact Resistance Using a Modern Plasma Asher", Mat. Res. Soc. Symp. Proc., vol. 495, 1998, pp. 342-352.
Lee et al., "Metal Corrosion in Wet Resist-Stripping Process", Proc. Interface, 1989, pp. 137-148.
Ambat et al., "The Influence of Ph on the Corrosion of Medium Strength Aerospace Alloys 8090, 2091 and 2014", Corrosion Science, vol. 33(5), 1992, p. 681-690.

* cited by examiner

*Primary Examiner* — Gregory Webb
(74) *Attorney, Agent, or Firm* — Hoffmann & Baron, LLP

(57) ABSTRACT

Highly alkaline, aqueous formulations including (a) water, (b) at least one metal ion-free base at sufficient amounts to produce a final formulation alkaline pH, (c) from about 0.01% to about 5% by weight (expressed as % $SiO_2$) of at least one water-soluble metal ion-free silicate corrosion inhibitors; (d) from about 0.01% to about 10% by weight of at least one metal chelating agent, and (e) from more than 0 to about 2.0% by weight of at least one oxymetalate are provided in accordance with this invention. Such formulations are combined with a peroxide such that a peroxymetalate is formed to produce form a microelectronic cleaning composition. Used to remove contaminants and residue from microelectronic devices, such as microelectronic substrates.

20 Claims, No Drawings

PEROXIDE ACTIVATED OXOMETALATE BASED FORMULATIONS FOR REMOVAL OF ETCH RESIDUE

CROSS REFERENCE TO RELATED APPLICATIONS

This application is a national stage application of PCT/US2008/001103, filed Jan. 28, 2008, which claims the benefit of U.S. Provisional Application No. 60/889,762 filed Feb. 14, 2007.

FIELD OF THE INVENTION

This invention relates to compositions useful for removing etch residue from microelectronic devices, which composition provides good corrosion resistance and improved cleaning efficiency. In particular the invention provides aqueous, highly alkaline oxometalate formulations activated by peroxide that are especially useful in the microelectronics industry and especially effective in removing etch residue from microelectronic substrates having metal lines and vias. The invention also provides method for cleaning such microelectronic substrates and devices employing such compositions.

BACKGROUND TO THE INVENTION

An integral part of microelectronic fabrication is the use of photoresists to transfer an image from a mask or reticle to the desired circuit layer. After the desired image transfer has been achieved, an etching process is used to form the desired structures. The most common structures formed in this way are metal lines and vias. The metal lines are used to form electrical connections between various parts of the integrated circuit that lie in the same fabrication layer. The vias are holes that are etched through dielectric layers and later filled with a conductive metal. These are used to make electrical connections between different vertical layers of the integrated circuit. A halogen containing gas is generally used in the processes used for forming metal lines and vias.

After the etching process has been completed, the bulk of the photoresist may be removed by either a chemical stripper solution or by an oxygen plasma ashing process. The problem is that these etching processes produce highly insoluble metal-containing residues that may not be removed by common chemical stripper solutions. Also, during an ashing process the metal-containing residues are oxidized and made even more difficult to remove, particularly in the case of aluminum-based integrated circuits. See, "Managing Etch and Implant Residue," Semiconductor International, August 1997, pages 56-63.

An example of such an etching process is the patterning of metal lines on an integrated circuit. In this process, a photoresist coating is applied over a metal film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual metal etching step is then performed. This etching step removes metal not covered by photoresist through the action of a gaseous plasma. Removal of such metal transfers the pattern from the photoresist layer to the metal layer. The remaining photoresist is then removed ("stripped") with an organic stripper solution or with an oxygen plasma ashing procedure. The ashing procedure is often followed by a rinsing step that uses a liquid organic stripper solution. However, the stripper solutions currently available, usually alkaline stripper solutions, leave insoluble metal oxides and other metal-containing residues on the integrated circuit.

Another example of such an etching process is the patterning of vias (interconnect holes) on an integrated circuit. In this process, a photoresist coating is applied over a dielectric film then imaged through a mask or reticle to selectively expose a pattern in the photoresist coating. The coating is developed to remove either exposed or unexposed photoresist, depending on the tone of the photoresist used, and produce a photoresist on the metal pattern. The remaining photoresist is usually hard-baked at high temperature to remove solvents and optionally to cross-link the polymer matrix. The actual dielectric etching step is then performed. This etching step removes dielectric not covered by photoresist through the action of a gaseous plasma. Removal of such dielectric transfers the pattern from the photoresist layer to the dielectric layer. The remaining photoresist is then removed ("stripped") with an organic stripper solution or with an oxygen plasma ashing procedure. Typically, the dielectric is etched to a point where the underlying metal layer is exposed. A titanium or titanium nitride anti-reflective or diffusion barrier layer is typically present at the metal/dielectric boundary. This boundary layer is usually etched through to expose the underlying metal. It has been found that the action of etching through the titanium or titanium nitride layer causes titanium to be incorporated into the etching residues formed inside of the via. Oxygen plasma ashing oxidizes these via residues making them more difficult to remove. A titanium residue removal enhancing agent must therefore be added to the stripper solution to enable the cleaning of these residues. See "Removal of Titanium Oxide Grown on Titanium Nitride and Reduction of Via Contact Resistance Using a Modern Plasma Asher", Mat. Res. Soc. Symp. Proc., Vol. 495, 1998, pages 345-352. The ashing procedure is often followed by a rinsing step that uses a liquid organic stripper solution. However, the stripper solutions currently available, usually alkaline stripper solutions, leave insoluble metal oxides and other metal-containing residues on the integrated circuit. There are some hydroxylamine-based strippers and post-ash residue removers on the market that have a high organic solvent content, but they are not as effective on other residues found in vias or on metal-lines. They also require a high temperature (typically 65° C. or higher) in order to clean the residues from the vias and metal-lines.

The use of alkaline strippers on microcircuit containing metal films has not always produced quality circuits, particularly when used with metal films containing aluminum or various combinations or alloys of active metals such as aluminum or titanium with more electropositive metals such as copper or tungsten. Various types of metal corrosion, such as corrosion whiskers, galvanic corrosion, pitting, notching of metal lines, have been observed due, at least in part, to reaction of the metals with alkaline strippers. Further it has been shown, by Lee et al., Proc. Interface '89, pp. 137-149, that very little corrosive action takes place until the water rinsing step that is required to remove the organic stripper from the wafer. The corrosion is evidently a result of contacting the metals with the strongly alkaline aqueous solution that is present during rinsing. Aluminum metal is known to corrode rapidly under such conditions, Ambat et al., Corrosion Science, Vol. 33 (5), p. 684. 1992.

Prior methods used to avoid this corrosion problem employed intermediate rinses with non-alkaline organic solvents such as isopropyl alcohol. However, such methods are expensive and have unwanted safety, chemical hygiene, and environmental consequences.

In U.S. Pat. No. 6,465,403 there is disclosed aqueous alkaline compositions useful in the microelectronics industry for stripping or cleaning semiconductor wafer substrates by removing photoresist residues and other unwanted contaminants. The aqueous compositions typically contain (a) one or more metal ion-free bases at sufficient amounts to produce a pH of about 10-13; (b) about 0.01% to about 5% by weight (expressed as % $SiO_2$) of a water-soluble metal ion-free silicate; (c) about 0.01% to about 10% by weight of one or more metal chelating agents and (d) optionally other ingredients.

However, none of the compositions disclosed in the prior art effectively remove all organic contamination and metal-containing residues remaining after a typical etching process. Silicon containing residues are particularly difficult to remove using these formulations. There is, therefore, a need for stripping compositions that clean semiconductor wafer substrates by removing inorganic and organic contamination from such substrates without damaging the integrated circuits. With the widespread use of single wafer tools, there is also a need for formulations that are able to remove metallic and organic contamination in less time and at lower temperatures than compositions in the prior art. Such compositions must not corrode the metal features that partially comprise the integrated circuit and should avoid the expense and adverse consequences caused by intermediate rinses. Tungsten and aluminum lines are particularly susceptible to corrosion upon cleaning with the formulations discussed in the previous paragraph.

SUMMARY OF THE INVENTION

In accordance with this invention there are provided highly alkaline, aqueous formulations comprising (a) water, (b) at least one metal ion-free base at sufficient amounts to produce a final composition of alkaline pH, preferably an alkaline pH of from about 11 to about 13.4, (c) from about 0.01% to about 5% by weight (expressed as % $SiO_2$) of at least one water-soluble metal ion-free silicate corrosion inhibitor; (d) from about 0.01% to about 10% by weight of at least one metal chelating agent, and (e) from more than 0 to about 2.0% by weight of at least one oxometalate. Such formulations are combined with at least one peroxide that reacts with the oxometalate to form a peroxometalate resulting in an aqueous, alkaline microelectronics cleaning compositions. The amount of water is the balance of the 100% by weight of the formulation or composition. All percentages mentioned in this application are percent by weight unless indicated otherwise and are based on the total weight of the composition.

The cleaning compositions are placed in contact with a semiconductor wafer substrate for a time and at a temperature sufficient to clean unwanted contaminants and/or residues from the substrate surface. The compositions of this invention provide enhanced corrosion resistance and improved cleaning efficiency.

DETAILED DESCRIPTION OF THE INVENTION AND PREFERRED EMBODIMENTS

Highly alkaline, aqueous formulation of this invention comprise (a) water, (b) at least one metal ion-free base at sufficient amounts to produce a final formulation of alkaline pH, preferably a pH of about 11 to about 13.4, (c) from about 0.01% to about 5% by weight (expressed as % $SiO_2$) of at least one water-soluble metal ion-free silicate corrosion inhibitor; (d) from about 0.01% to about 10% by weight of at least one metal chelating agent, and (e) from more than 0 to about 2.0% by weight of at least one oxometalate are provided in accordance with this invention. Such formulations are combined with at least one peroxide reactive with the oxometalates of the formulation such that peroxometalates are formed prior to use of the resulting cleaning compositions. The resulting compositions are placed in contact with a microelectronic device such as a semiconductor wafer substrate for a time and at a temperature sufficient to clean unwanted contaminants and/or residues from the substrate surface.

The present invention provides new aqueous formulations for combining with a peroxide for stripping and cleaning semiconductor wafer surfaces of contaminants and residues which formulations contain water (preferably high purity deionized water), one or more metal ion-free bases, one or more metal ion-free silicate corrosion inhibitors, one or more metal chelating agents and one or more oxometalates.

Any suitable base may be used in the aqueous formulations of the present invention. The bases are preferably quaternary ammonium hydroxides, such as tetraalkyl ammonium hydroxides (including hydroxy- and alkoxy-containing alkyl groups generally of from 1 to 4 carbon atoms in the alkyl or alkoxy group). The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraethyl ammonium hydroxide, tetrapropyl ammonium hydroxide, tetrabutyl ammonium hydroxide, monomethyl-triethyl ammonium hydroxide, monomethyltripropyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof.

Other bases that will function in the present invention include ammonium hydroxide, organic amines particularly alkanolamines such as 2-aminoethanol, 1-amino-2-propanol, 1-amino-3-propanol, 2-(2-aminoethoxy)ethanol, 2-(2-aminoethylamino)ethanol, 2-(2-aminoethylamino)ethylamine and the like, and other strong organic bases such as guanidine, 1,3-pentanediamine, 4-aminomethyl-1,8-octanediamine, aminoethylpiperazine, 4-(3-aminopropyl)morpholine, 1,2-diaminocyclohexane, tris(2-aminoethyl)amine, 2-methyl-1,5-pentanediamine and hydroxylamine. Alkaline solutions containing metal ions such as sodium or potassium may also be operative, but are not preferred because of the possible residual metal contamination that could occur. Mixtures of these additional alkaline components, particularly ammonium hydroxide, with the aforementioned tetraalkyl ammonium hydroxides are also useful.

The metal ion-free base will be employed in the formulations in an amount effective to provide a highly alkaline pH to the final formulations, generally a pH of from about 11 to about 13.4.

Any suitable metal ion-free silicate may be used in the formulations of the present invention. The silicates are preferably quaternary ammonium silicates, such as tetraalkyl ammonium silicate (including hydroxy- and alkoxy-containing alkyl groups generally of from 1 to 4 carbon atoms in the alkyl or alkoxy group). The most preferable metal ion-free silicate component is tetramethyl ammonium silicate. Other suitable metal ion-free silicate sources for this invention may be generated in-situ by dissolving any one or more of the following materials in the highly alkaline cleaner. Suitable metal ion-free materials useful for generating silicates in the cleaner are solid silicon wafers, silicic acid, colloidal silica, fumed silica or any other suitable form of silicon or silica.

At least one metal ion-free silicate will be present in the formulation in an amount from about 0.01 to about 5% by weight, preferably from about 0.01 to about 2%.

The formulations of the present invention are also formulated with suitable one or more metal chelating agents to increase the capacity of the formulation to retain metals in solution and to enhance the dissolution of metallic residues on the wafer substrate. Typical examples of metal chelating agents useful for this purpose are the following organic acids and their isomers and salts: (ethylenedinitrilo)tetraacetic acid (EDTA), butylenediaminetetraacetic acid, cyclohexane-1,2-diaminetetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra(methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid,lactic acid, salicylic acid, catechol, gallic acid, propyl gallate, pyrogallol, 8-hydroxyquinoline, and cysteine.

Preferred as the metal chelating agents are aminocarboxylic acids such as cyclohexane-1,2-diaminetetraacetic acid (CyDTA). Metal chelating agents of this class have a high affinity for the aluminum-containing residues typically found on metal lines and vias after plasma "ashing". In addition, the pKa's for this class of metal chelating agents typically include one pKa of approximately 12 which improves the performance of the compositions of the invention.

At least one metal chelating agent will be present in the formulation in an amount from about 0.01 to about 10% by weight, preferably in an amount from about 0.01 to about 2%

Any suitable oxometalate of the transition metals from Groups V and VI of the periodic chart may be employed in the formulations of this invention. The oxometalate component may comprise one or more oxometalates selected from mononuclear oxometalates, homopolynuclear oxometalates and heteropolynuclear oxometalates. The transition metal oxometalates of this invention comprise oxometalates of molybdenum (Mo), tungsten (W), vanadium (V), niobium (Nb), chromium (Cr) or tantalum (Ta). The oxometalate will be present in the formulation in an amount of more than 0 to about 2%, preferably in an amount from about 0.01 to 2% by weight.

Suitable mononuclear oxometalates include those of the formula $[MO_p]^{n-}Z^+$, where M are high oxidation state early transition metals such as Cr, V, Mo, W, Nb, and Ta and Z is a charge balancing counter-ion. The most preferred charge balancing counter-ions are protons, tetraalkyl ammonium, and ammonium cations. Metal ions such as sodium or potassium are also operative, but are not preferred because of the possible residual metal contamination that could occur. One example of such a suitable mononuclear oxometalate is, for example, $(NH_4)_2MoO_4$, where $NH_4^+$ is the charge balancing counter-ion and $MoO_4^-$ is the oxometalate.

Suitable homopolynuclear oxometalates include those of the formula $[M_mO_p]^{n-}Z^+$, where M are high oxidation state early transition metals such as Cr, V, Mo, W, Nb, and Ta and Z is a charge balancing counter-ion. These are formed from the mononuclear oxometalates by condensation with acid. One example of a suitable homopolynuclear oxometalate is $(NH_4)_6Mo_7O_{24}$ where $NH_4^+$ is the charge balancing counter-ion and $Mo_7O_{24}^{6-}$ is the homopolynuclear oxometalate. Suitable heteropolynuclear oxometalates include those of the formula $[X_xM_mO_p]^{n-}Z^+$ where M are high oxidation state early transition metals such as Cr, V, Mo, W, Nb, and Ta; X is a heteroatom that can be either a transition metal or a main group element and Z is a charge balancing counter-ion. One example of a suitable heteropolynuclear oxometalate is $H_4SiW_{12}O_{40}$, where $H^+$ is the charge balancing counter ion, Si is the heteroatom X, and W is the early transition metal M.

The formulations of this invention may contain optional ingredients that are not harmful to the effectiveness of the cleaning composition, such as for example, surfactants, residue remover enhancers, and the like.

Suitable oxometalates for the formulations of this invention include, but are not limited to, ammonium molybdate ($(NH_4)_2MoO_4$), ammonium tungstate ($(NH_4)_2WO_4$), tungstic acid ($H_2WO_4$), ammonium metavanadate ($NH_4VO_3$), ammonium heptamolydbate ($(NH_4)_6Mo_7O_{24}$), ammonium metatungstate ($(NH_4)_6H_2W_{12}O_{40}$), ammonium paratungstate ($(NH_4)_{10}H_2W_{12}O_{42}$), tetramethylammonium decavanadate ($(TMA)_4H_2V_{10}O_{28}$), tetramethylammonium decaniobate ($(TMA)_6Nb_{10}O_{28}$), ammonium dichromate ($(NH_4)_2Cr_2O_7$), ammonium phosphomolybdate ($(NH_4)_3PMo_{12}O_{40}$, silicotungstic acid ($H_4SiW_{12}O_{40}$), phosphotungstic acid ($H_3PW_{12}O_{40}$), phosphomolybdic acid ($H_3PMo_{12}O_{40}$), silicomolybdic acid ($H_4SiMo_{12}O_{40}$), and molybdovanadophosphates ($H_5PMo_{10}V_2O_{40}$).

Example of preferred formulations of this invention include, but are not limited to, formulations that comprise 2.1% tetramethylammonium hydroxide, 0.14% tetramethylammonium silicate, 0.12% trans-1,2-cyclohexanediamine tetraacetic acid, and from about 0.01 to about 2% ammonium molybdate or silicotungstic acid and the balance water to 100%.

The afore-described formulations will be combined with at least one peroxide in a ratio of said formulation to peroxide from about 5:1 to about 40:1, preferably a ratio of from 15:1 to 30:1, and most preferably at a ratio of 20:1 to provide microelectronic cleaning compositions. Any suitable peroxide that is reactive with the oxometalates of the afore-described formulations so as to form peroxometalates may be employed. Suitable peroxides include hydrogen peroxide; peroxyacids such as peroxydiphosphoric acid ($H_4P_2O_8$), peroxydisulfuric acid ($H_4S_2O_8$), phthalimidoperoxycaproic acid, peroxyacetic acid ($C_2H_4O_3$), peroxybenzoic acid, diperoxyphthalic acid, and salts thereof; and alkyl peroxides such as benzoyl peroxide, methyl ethyl ketone peroxide, dicumyl peroxide, tert-butylcumyl peroxide. The preferred peroxide is hydrogen peroxide.

The enhanced cleaning efficiency is believed to be a result of the activation of peroxide by these oxometalate species. In basic solution, oxometalates (Metal=$W^{VI}$, $Mo^{VI}$, $Cr^{VI}$, $V^V$, $Nb^V$, and $Ta^V$) react with peroxides to form inorganic peroxometalates. These peroxometalates may enhance cleaning in two ways. First, peroxometalates decompose to generate singlet oxygen, a highly reactive radical oxidizer that is a stronger oxidant than hydrogen peroxide. It is believed that this singlet oxygen may improve residue oxidation and therefore improve dissolution of the residue. Peroxometalates are also known to be efficient catalysts for the oxidation of organics by peroxide. This catalytic activity may enhance oxidation and removal of carbon based residues.

Because of the decomposition of the resulting peroxometalates generated in the combined solution, the lifetime of these solutions is generally limited. Based on the red color of solution generated by peroxomolybdate, the preferred formulation described above that contains ammonium molybdate when mixed with hydrogen peroxide (20%) in a 20:1 dilution displays a lifetime between 5 minutes (2% ammonium molybdate) and 45 minutes (0.01% ammonium molybdate) at 25°. In the case of the preferred formulation described above that contains silicotungstic acid, the lifetime of the cleaning composition resulting from the formulation being mixed with 20% hydrogen peroxide (20:1) is much longer, between 45 minutes (2% silicotungstic acid) and 5 hrs (0.01% silicotungstic acid) based on the color change. A measurement of Al etch rate changes for the cleaning composition comprising the preferred formulation described above that contains silicotungstic acid (0.5%) when mixed with hydrogen peroxide 20% in a 20:1 dilution displayed a bath life of only 3.5 hrs, but the composition could be reactivated by spiking with hydrogen peroxide. Heating of these compositions results in a dramatic decrease in the lifetime of these compositions.

One other concern of using oxometalates in these cleaning compositions for the semiconductor and microchip industries is the possibility of metals left on the wafer surface after treatment. Metal absorption of molybdenum and tungsten from these compositions were tested using XPS (X-ray photoelectron spectroscopy). After treatment of Al and TEOS wafers in ammonium molybdate and silicotungstate containing preferred formulations described above mixed in a 20:1 ratio with hydrogen peroxide (20%), rinsing for 1 min. in DI water, and drying in Ar, no Mo or W were observed on any of the wafer surfaces. This suggests that these metal anions can easily be rinsed from wafer surfaces and transition metal contamination should not be a problem with these formulations.

Etching rates of cleaning compositions of this invention were measured at 25° C. with the preferred formulations described above to which was added 20% hydrogen peroxide at a dilution ratio of 20:1. For comparison, a control formulation was prepared without any oxometalate (control formulation=water, 2.1% tetramethylammonium hydroxide, 0.14% tetramethylammonium silicate, 0.12% trans-1,2-cyclohexanediamine tetraacetic acid. All tested preferred cleaning compositions containing silicotungstic acid or ammonium molybdate did not significantly reduce Al, Ti, and TEOS etch rates comparable to the Control formulation but W etch rates were approximately one half of those obtained with the Control formulation.

Cleaning efficiencies of these preferred formulations to which was added 20% hydrogen peroxide at a ratio of 20:1 were tested on both Al metal lines and vias. As a control, the Control formulation of the previous paragraph was used. In the case of the tested Al metal lines, the Control formulation could only remove all the residue after 5 min. at 45° C., but galvanic corrosion was always observed, even after 5 min. at 25° C. For both preferred formulations, a dramatic decrease in galvanic corrosion was observed compared to the control formulation, and residue removal was accomplished at a reduced temperature and treatment time. For the preferred formulation containing ammonium molybdate (0.1%), these metal lines were cleaned without corrosion in as little as 2 min. at 25° C., For the preferred formulation containing silicotungstic acid (0.5%), the metal lines could be completely cleaned in 2 min. at 25° C., with almost no corrosion observed. In the case of the tested Al vias, the Control formulation could clean the vias in as little as 5 min. at 25° C. with a 20% hydrogen peroxide ratio of 20:1. The preferred formulation with silicotungstic acid allowed for a higher ratio of formulation to 20% hydrogen peroxide (30:1) to be used without the increased corrosion observed with the Control formulation. Cleaning could be done in this case in as little as 2 min. at 25° C.

In general, the preferred formulations containing silicotungstic acid and ammonium molybdate display improved corrosion inhibition and cleaning efficiency over the Control formulation. Also in both cases, tungsten etch rates are cut nearly in half relative to the control formulation.

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

The invention claimed is:

1. An alkaline, aqueous formulation for combining with peroxide for cleaning a microelectronic device, the formulation comprising: (a) water, (b) at least one metal ion-free base at sufficient amounts to produce a final formulation having an alkaline pH (c) from about 0.01% to about 5% by weight (expressed as % $SiO_2$) of at least one water-soluble metal ion-free silicate corrosion inhibitor; (d) from about 0.01% to about 10% by weight of at least one metal chelating agent, and (e) from more than 0 to about 2.0% by weight of at least one oxometalate.

2. A formulation according to claim 1 wherein the oxometalate is an oxometalate of a metal selected from the group consisting of molybdenum (Mo), tungsten (W), vanadium (V), niobium (Nb), chromium (Cr) and tantalum (Ta).

3. A formulation according to claim 2 wherein the oxometalate is selected from the group consisting of mononuclear oxometalates, homopolynuclear oxometalates and heteropolynuclear oxometalates.

4. A formulation according to claim 2 wherein the alkaline pH of the formulation is from about pH 11 to about 13.4.

5. A formulation according to claim 2 wherein the metal ion-free base is an ammonium hydroxide, the metal ion-free silicate is a quaternary ammonium silicate, and the metal chelating agent is an aminocarboxylic acid.

6. A formulation according to claim 5 wherein the oxometalate is selected from the group consisting of ammonium molybdate ($(NH_4)_2MoO_4$), ammonium tungstate ($(NH_4)_2WO_4$), tungstic acid ($H_2WO_4$), ammonium metavanadate ($NH_4VO_3$), ammonium heptamolydbate ($(NH_4)_6Mo_7O_{24}$), ammonium metatungstate ($(NH_4)_6H_2W_{12}O_{40}$), ammonium paratungstate ($(NH_4)_{10}H_2W_{12}O_{42}$), tetramethylammonium decavanadate ($(TMA)_4H_2V_{10}O_{28}$), tetramethylammonium decaniobate ($(TMA)_6Nb_{10}O_{28}$), ammonium dichromate ($(NH_4)_2Cr_2O_7$), ammonium phosphomolybdate ($(NH_4)_3PMo_{12}O_{40}$, silicotungstic acid ($H_4SiW_{12}O_{40}$), phosphotungstic acid ($H_3PW_{12}O_{40}$), phosphomolybdic acid ($H_3PMo_{12}O_{40}$), silicomolybdic acid ($H_4SiMo_{12}O_{40}$), and molybdovanadophosphates ($H_5PMo_{10}V_2O_{40}$).

7. A formulation according to claim 6 wherein the metal ion-free base is tetramethylammonium hydroxide, the metal ion-free silicate is tetramethylammonium silicate, the metal chelating agent is trans-1,2-cyclohexanediamine tetraacetic acid, and the oxometalate is selected from the group consisting of ammonium molybdate and silicotungstic acid.

8. A formulation according to claim 7 comprising 2.1% tetramethylammonium hydroxide, 0.14% tetramethylammonium silicate, 0.12% trans-1,2-cyclohexanediamine tetraacetic acid, and from about 0.01 to about 2% of the oxometalate, and the balance water to 100%.

9. A formulation according to claim 8 wherein the oxometalate is ammonium molybdate.

10. A formulation according to claim 8 wherein the oxomolybdate is silicotungstic acid.

11. An alkaline, aqueous cleaning composition for cleaning a microelectronic device, the cleaning composition comprising the formulation according to claim 1 admixed with at least one peroxide in a ratio of the formulation to peroxide from about 5:1 to about 40:1 and wherein the at least one peroxide is reactive with the oxometalate to form a peroxometalate.

12. An alkaline, aqueous cleaning composition for cleaning a microelectronic device, the cleaning composition comprising the formulation according to claim 2 admixed with at least one peroxide in a ratio of the formulation to peroxide from about 5:1 to about 40:1 and wherein the at least one peroxide is reactive with the oxometalate to form a peroxometalate.

13. An alkaline, aqueous cleaning composition for cleaning a microelectronic device, the cleaning composition comprising the formulation according to claim 7 admixed with at least one peroxide in a ratio of the formulation to peroxide from about 5:1 to about 40:1 and wherein the at least one peroxide is reactive with the oxometalate to form a peroxometalate.

14. An alkaline, aqueous cleaning composition according to claim 11 wherein the at least one peroxide comprises hydrogen peroxide.

15. An alkaline, aqueous cleaning composition according to claim 12 wherein the at least one peroxide comprises hydrogen peroxide.

16. An alkaline, aqueous cleaning composition according to claim 13 wherein the at least one peroxide comprises hydrogen peroxide.

17. A process for cleaning contaminants or residue from a microelectronic substrate comprising contacting the microelectronic substrate with a cleaning composition of claim 11 for a time and temperature sufficient to remove the contaminants or residue.

18. A process for cleaning contaminants or residue from a microelectronic substrate comprising contacting the microelectronic substrate with a cleaning composition of claim 12 for a time and temperature sufficient to remove the contaminants or residue.

19. A process for cleaning contaminants or residue from a microelectronic substrate comprising contacting the microelectronic substrate with a cleaning composition of claim 13 for a time and temperature sufficient to remove the contaminants or residue.

20. A process for cleaning contaminants or residue from a microelectronic substrate comprising contacting the microelectronic substrate with a cleaning composition of claim 16 for a time and temperature sufficient to remove the contaminants or residue.

* * * * *